Figure 1:
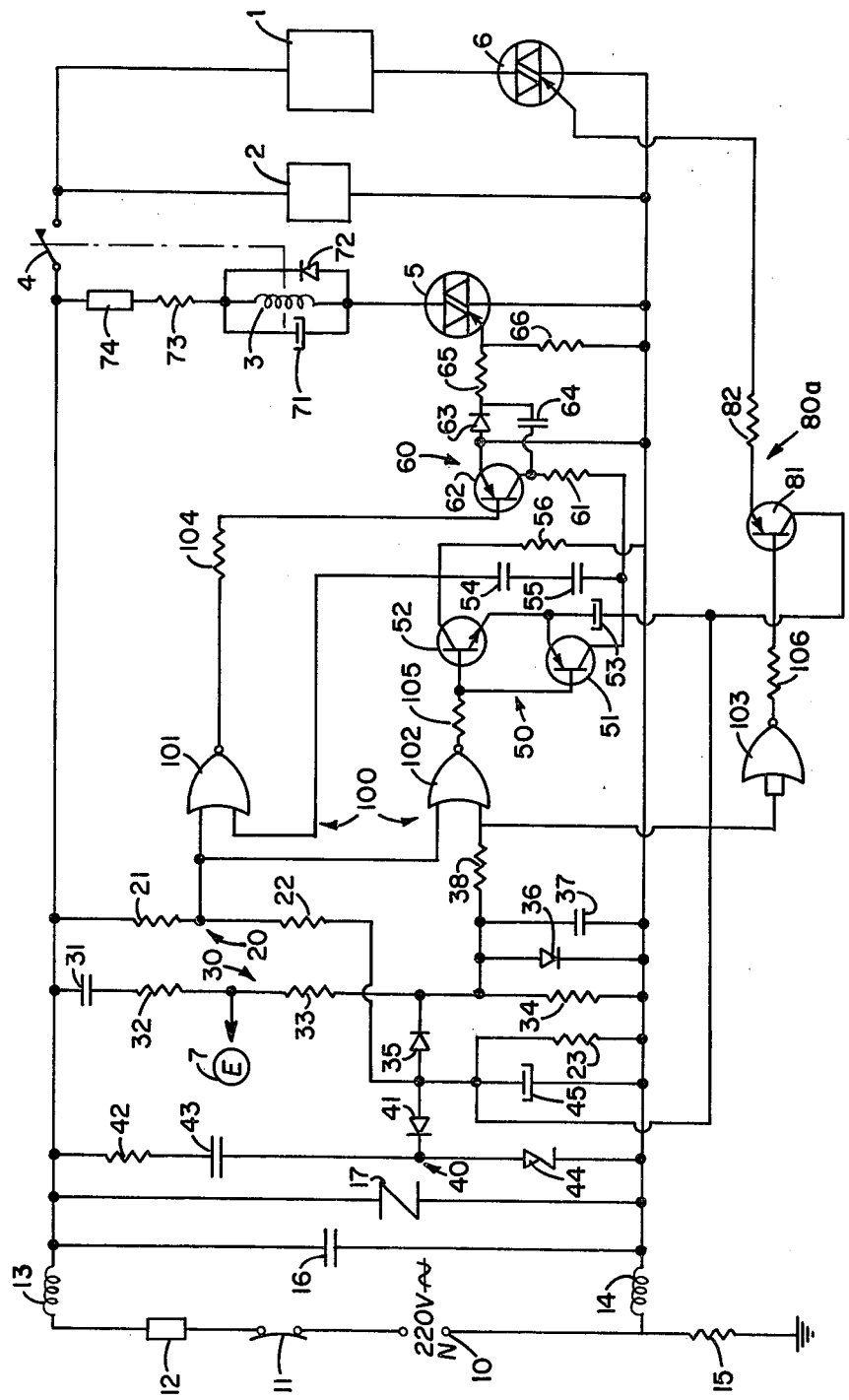

United States Patent [19]
Gaiffier

[11] Patent Number: 4,457,701
[45] Date of Patent: Jul. 3, 1984

[54] CONTROL CIRCUIT FOR A SEMI-CONDUCTOR POWER ELEMENT AND APPLICATION TO A BURNER SAFETY DEVICE

[75] Inventor: Albert Gaiffier, Le Puy, France
[73] Assignee: Constructions Electriques R.V., Brives Charensac, France
[21] Appl. No.: 377,364
[22] Filed: May 12, 1982
[30] Foreign Application Priority Data
  May 12, 1981 [FR] France ................................. 81 09808
[51] Int. Cl.³ .............................................. F23N 5/00
[52] U.S. Cl. ........................................ 431/24; 431/46; 431/78
[58] Field of Search ....................... 431/24, 25, 42, 43, 431/59, 60, 74, 78, 46; 307/117, 360

[56] References Cited
U.S. PATENT DOCUMENTS
  3,902,839  9/1975  Matthews ............................. 431/46
  4,082,493  4/1978  Dahlgren ............................. 431/25
  4,088,984  5/1978  Muramoto et al. ................... 431/78
  4,324,542  4/1982  Challet ................................. 431/78

FOREIGN PATENT DOCUMENTS
  2034134  5/1980  United Kingdom .................. 431/78

Primary Examiner—Lee E. Barrett
Attorney, Agent, or Firm—Weingarten, Schurgin, Gagnebin & Hayes

[57] ABSTRACT

The invention relates to a control circuit for a semi-conductor power element, comprising a circuit generating a signal synchronous with the variable current supply signal of the semi-conductor power element, and a logic circuit with high input impedance to receive directly, on the one hand, the said synchronous signal and, on the other hand, the low strength detection signal and which is such that the delay circuit is combined to the high input impedance logic circuit to prevent the production of control pulses on the electrode controlling the semi-conductor or power element, if one of the components of the control circuit should become faulty.

The invention finds an application in burner control and safety devices.

12 Claims, 11 Drawing Figures

CONTROL CIRCUIT FOR A SEMI-CONDUCTOR POWER ELEMENT AND APPLICATION TO A BURNER SAFETY DEVICE

The present invention relates to a control circuit for a semi-conductor or power element with controlled electrode, comprising a detector circuit delivering a low strength detection signal, a direct current amplifying circuit to current-amplify the said detection signal, a delay circuit associated to the direct current amplifier, and a pulse-generating circuit to apply on the control electrode controlling the semi-conductor power element a pulse signal dependent on said detection signal.

The present invention relates more particularly to an electrical amplifying device for a low strength signal, capable of stopping the power supply to the output member if any one of its components becomes faulty.

Such an amplifying system is useful in applications where the safety of people or of property is endangered, due to a bad operation of the amplifier which would result in said amplifier supplying the output member without the corresponding control signal.

This can occur for example in the control and safety boxes of gas or fuel burners where, after a short igniting period, the fluid fuel supply is subject to the effective presence of the combustion flame.

Thus, the control circuit according to the invention is more particularly intended for use in combination with a method for detecting a flame by ionization, making use of the rectifying properties of the flame, and it is advantageously applied to a safety device for burners.

It is a known fact that the flame-detection by ionization method, although safe in itself, has the disadvantage of being only capable of delivering a very low signal, normally of the order of one microampere or even less, which requires to be considerably amplified before it can be used to control power elements associated for example to fluid-control devices such as an electro-valve.

D.C. type amplifiers have already been produced which use a low strength detection signal to control an output member (relays or electro-valve). The amplification system is then inserted in a sequential circuit which controls it automatically through a pre-ignition phase, and during which the condition of an output member is checked, so that for example the supply of fluid fuel via said output member can be definitely stopped if a fault is discovered.

This precaution does not however eliminate the possibility of a permanent or intermittent breakdown occurring during the flame-monitoring phase, breakdown of which no warning is given and which places the device in a condition which is all the more dangerous that it still appears to be working normally.

This type of fault is always liable to occur in a D.C. type amplifier, which is known for its sensitivity to temperature, and this even more so that it is precisely placed close to a source of heat which it helps to control.

What can happen then is that for example, if the ambient temperature rises, a D.C. amplifier will develop a drift which is superimposed on the input signal, hiding the eventual disappearance of said signal.

Various means have been proposed to eliminate this risk, such as sampling or carrier frequency amplifiers, or accentuators of various natures. These means all lead however to relatively complex and expensive circuits and remain often subject to certain operational risks.

It is precisely the object of the present invention to overcome these drawbacks by permitting the production of a control circuit adapted to be automatically brought to a safety condition in case of a faulty component, in order to ensure that no output power will be supplied if the detection signal is not accurately used by the control circuit.

A further object of the invention is to produce a permanently safe control circuit which is altogether reliable to use, economical and requires little space.

These objects are reached according to the invention with a control circuit for a semi-conductor power element with controlled electrode, of the type defined hereinabove and which, according to the invention, further comprises a circuit generating a signal synchronous with the variable current supply signal of the semi-conductor power element, and a logic circuit with high input impedance to receive directly, on the one hand, the said synchronous signal and, on the other hand, the low strength detection signal and is such that the delay circuit is associated to the high input impedance logic circuit to prevent the production of control pulses on the electrode controlling the semi-conductor power element, if one of the components of the control circuit should become faulty.

More specifically, the high input impedance logic circuit comprises a first gate of which a first input is connected to the circuit generating a synchronous signal, a second input being connected to the output of the delay circuit and the output being connected to the input of the pulse generating circuit, and a second gate of which a first input is connected to the circuit generating a synchronous signal, whilst a second input is connected to the detection circuit and the output is connected to the input of the delay circuit.

According to a special characteristic of the invention, the detection circuit and the circuit generating a synchronous signal each comprises a voltage divider bridge.

The control circuit further comprises a circuit producing a low D.C. voltage from the A.C. voltage supplying the control circuit.

According to an advantageous embodiment of the invention, the delay circuit comprises first and second complementary transistors, the bases of which are connected to the output of the second gate via a connecting resistor, and the transmitters are connected together, at least one capacitor connected in parallel to the collector-transmitter space of the first transistor and at least one capacitor connected in parallel between the collectors of the first and second transistors, the collector of one of the transistors being connected to a pole of the circuit producing the said low D.C. voltage, whereas the collector of the other transistor is connected, on the one hand, to the second input of the first gate, and on the other hand, via a connecting resistor to one of the terminals of the source of A.C. voltage supplying the control circuit.

The control circuit according to the invention is especially advantageous when combined with a semi-conductor power element constituted by a triac mounted in series with a controllable control member such as a D.C. coil, a trip coil for example, the control member being itself mounted in parallel with a capacitor and a diode, and in series with a resistor.

The control circuit according to the invention is also very useful when the detection circuit is equipped with an ionization-type sensor constituted by a flame-detecting electrode.

The invention is particularly applicable to a burner safety and control device, designed to control an electro-valve supplying fluid fuel from a combustion flame detection system, which device then comprises a control circuit according to the invention controlling a semi-conductor power element with controlled electrode, permitting to switch on a control switch controlling the electro-valve when a flame is detected and to automatically switch off said switch when a fault occurs in said control circuit.

In this case, the device can further comprise another semi-conductor power element with controlled electrode, to control an igniter and the electrode controlling said other semi-conductor power element is connected to the detection circuit via at least one gate and one amplifying control circuit.

According to a special embodiment of the invention, the device comprises an inverter gate, connected to the output of the first gate, and a third gate, of which one input is connected to the output of said second gate, whereas a second input is connected to the output of said inverter gate, and the output is connected via a pulse-generating circuit to the electrode controlling the other semi-conductor power element controlling the igniter.

The invention will be more readily understood on reading the following description with reference to the accompanying drawings in which:

FIG. 1 is a diagram of one example of circuit according to the invention.

Figure 2A:
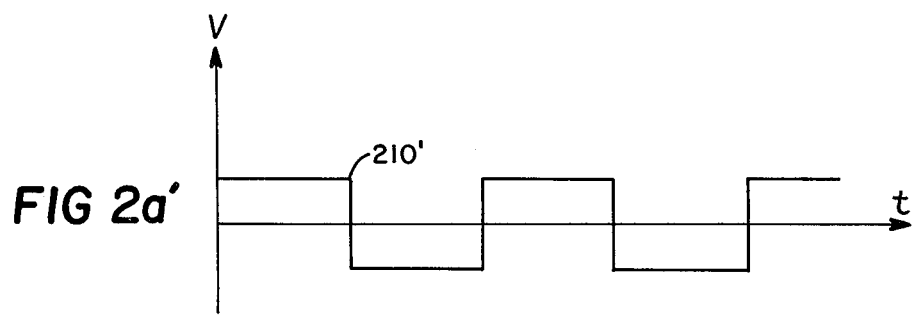
Figure 2A:
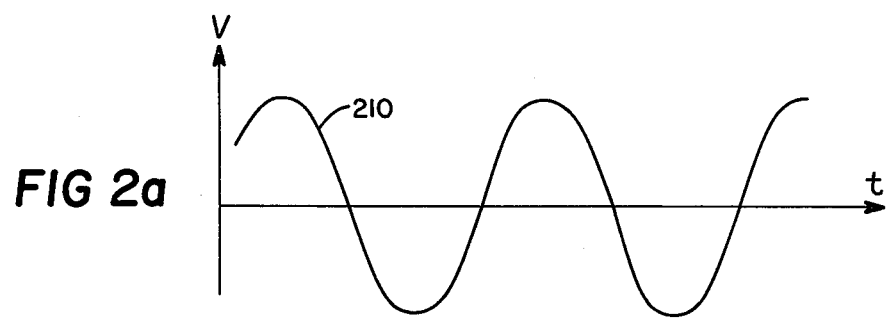
Figure 3A:
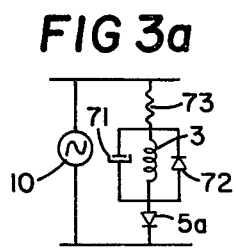
Figure 3B:
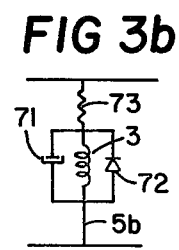
Figure 3C:
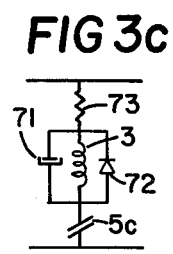
Figure 3D:
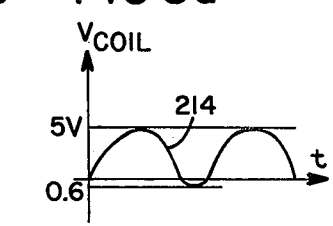
Figure 4:
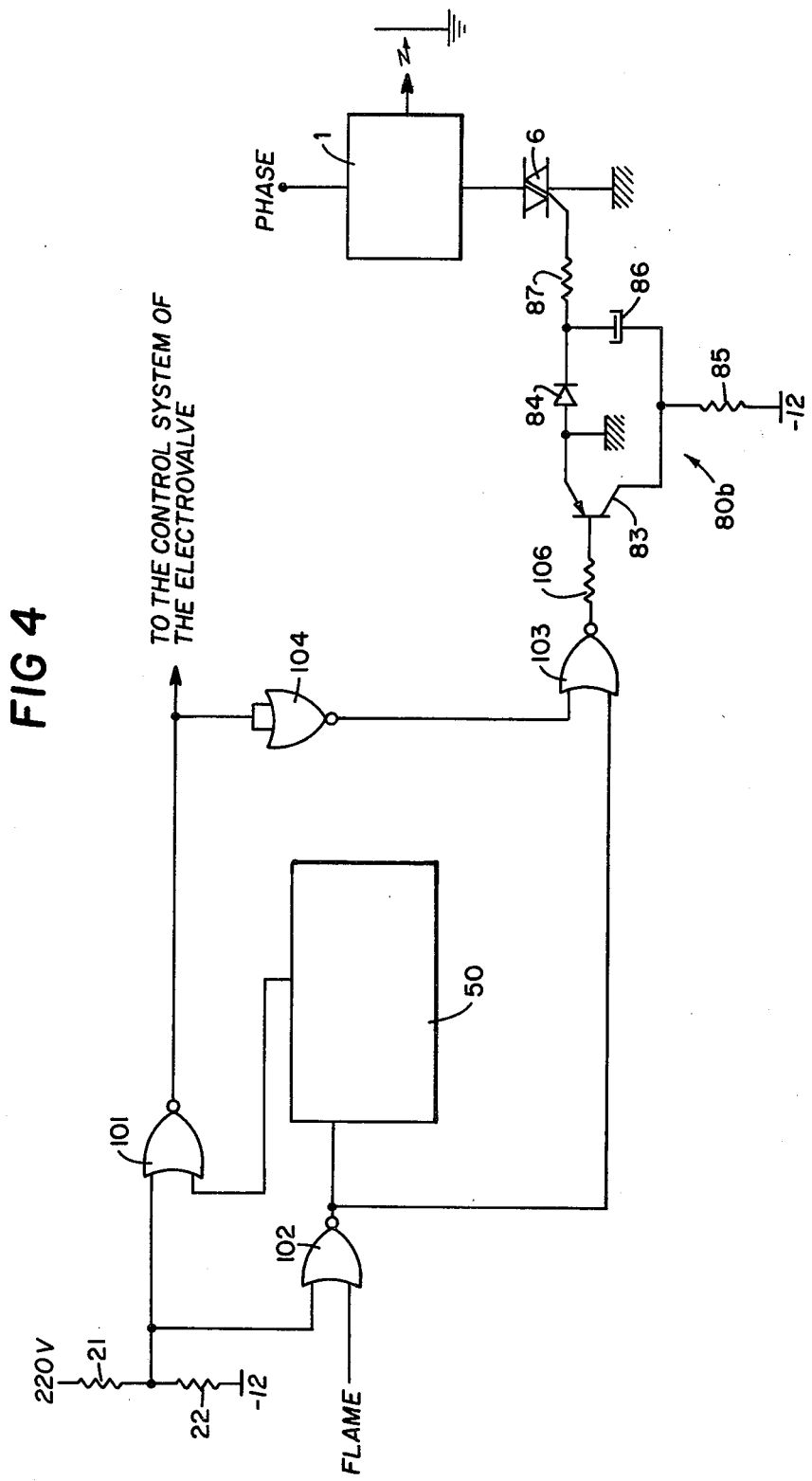

FIGS. 2a, 2a' to 2d show various forms of signals appearing at different points of the circuit shown in FIG. 1, FIGS. 3a to 3c show equivalent diagrams of part of the circuit shown in FIG. 1, depending on the condition of the controlled semi-conductor power element, FIG. 3d shows the voltage curve at the terminals of a controlled output member, in the case illustrated in FIG. 3b, and FIG. 4 is a diagram of part of the circuit shown in FIG. 1, and showing a variant embodiment for application to the control of a burner.

FIG. 1 shows a burner control and safety device assembly, comprising an igniter 1 and an electro-valve 2 supplying fluid fuel to the burner. Said electro-valve 2 and igniter 1 are energized by way of a relay contact 4. By closing the contact 4, an A.C. supply is applied to the terminals of the electro-valve 2 from a source of voltage 10 such as the system which in known manner is associated to safety (fuse 12) and control (thermostat 11) elements and to stabilizing (resistor 15) and suppression filtering (inductors 13, 14, capacitor 16, varistor 17) elements.

The coil 3 of the relay controlling the electro-valve 2 is connected to the assembly applying the supply voltage and consisting of a resistor 73, a fuse 74, and a triac 5. A capacitor 71 and a diode 72 are also connected in parallel to the coil 3. A control circuit, to be described in detail hereinafter, enables to control the triac 5 via its control electrode, and from signals supplied by a flame detector 7 which is advantageously an ionization-type sensor, and can simply be an electrode dipped into the flame to be detected. It will be noted that this same electrode 7 associated to the burner can also be used to ignite the fluid by way of high voltage sparks.

The control circuit associated to the detector 7 which constitutes a D.C. amplifier capable of amplifying the very low signal supplied by the detector 7, also enables to control an extra triac 6 connected in series with the igniter 1 on the terminals of the electro-valve 2.

The control circuit, making use of the signal supplied from the detector 7 to control the triac 5 and hence the relay 3, 4 associated to the electro-valve 2, is essentially designed so as to prevent all control of the electro-valve 2 in the event that one of the components of this circuit becomes faulty, and in doing so it enables to obtain an intrinsic safety which prevents the burner from working in dangerous conditions. The different circuits composing the circuit controlling the triac 5 will now be described in detail.

A detection circuit 30 associated to the sensor 7, comprises, connected in series with the terminals of a voltage supplying circuit, a capacitor 31 permitting a galvanic insulation of the detection system and of the resistors 32, 33, 34, the latter defining a high impedance detection assembly. The sensor 7 is connected to the junction of resistors 32 and 33, and the output signal of the detection stage is taken at the level of the junction of resistors 33 and 34. Said resistors 32, 33, 34 thus constitute divider bridges and can be adjusted to define the thresholds and sensitivity required for the applications considered.

A circuit 40 of low voltage negative supply comprises, connected in series with the terminals of the Zener diode 17, a resistor 42, a capacitor 43 and a Zener diode 44, of which the anode connected to the capacitor 43 defines the negative pole of the circuit 10. The series circuit constituted by a capacitor 45 and a diode 41, of which the cathode is connected to the anode of the Zener diode 44, is mounted in parallel on the Zener diode 44. A diode 35 is also connected by its anode to the diode 41 and by its cathode to the junction of resistors 33 and 34.

A circuit 20 constituted by a divider bridge formed by resistors 21, 22, 23 mounted in series on the terminals of the supply circuit enables to pick up on the junction of the resistors 21 and 22 a square signal 210' (FIG. 22a') which is synchronous to the alternating signal 210 of the A.C. supply source (FIG. 2a). The resistor 23 is itself connected in parallel to the capacitor 45.

Circuits 20, 30 and 40 cooperate with a logic circuit 100 combined with a delay circuit 50 to control a pulse generator 60 designed to apply to the control electrode of the triac 5 control pulses synchronous with the A.C. supply, in those cases when a signal indicating the presence of a flame is effectively outputted by the sensor 7 and when the components of the circuit themselves are in good working condition.

Figure 2B:
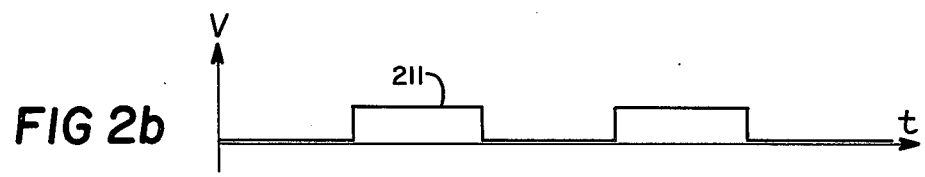

The logic circuit 100 comprises a first logic NOR gate 101 of which a first input is connected to the common point between the resistors 21 and 22 of the stage 20 producing the rectangular-shaped signals, and a second input is connected to the output of the delay circuit 50. The output of gate 101 shown at 211 in FIG. 2b is itself connected via a resistor 104 to the input of the pulse generating circuit 60. A second logic NOR gate 102 has a first input connected to the first input of NOR gate 101 and a second input connected via a resistor 38 to the junction of resistors 33 and 34. A diode 36 and a capacitor 37 are also connected, each in parallel on the resistor 34. The output of NOR gate 102 is connected via a resistor 105 to the input of the delay circuit 50.

Said igniting delay circuit 50 comprises a PNP transistor 51 and NPN transistor 52 of which the bases are connected to the resistor 105 and the transmitters are interconnected. A capacitor 53 is mounted in parallel on the collector-transmitter space of the transistor 51 whereas the series connection of capacitors 54 and 55 is connected in parallel between the collectors of transistors 51 and 52.

The collector of transistor 51 is connected to the junction of diodes 41 and 35 and therefore to the negative pole of the low voltage negative supply, whereas the collector of transistor 52 is connected, on the one hand via a resistor 56 to the earthed pole of the supply source 10 and, on the other hand, to the second input of NOR gate 101.

The pulse generating circuit 60 constitutes an amplifier-differentiator circuit and comprises a PNP transistor 62 the base of which is connected to the resistor 104, the collector is connected via a resistor 61 to the junction of diodes 41 and 35 constituting a negative pole, and the transmitter is connected to the earthed pole of the supply source and to the anode of a diode 63. A capacitor 64 is also connected between the collector of transistor 62 and the cathode of diode 63. A resistor 65 connects the cathode of diode 63 to the gate of the triac 5 whereas a resistor 66 is connected between said gate and the earthed (or neutral) pole of the supply source.

The circuit described hereinabove works as follows.

If no flame is detected by the electrode 7, a high level is applied to one input of the logic gate 102. Then, the synchronous rectangular-shaped signal picked up by the divider bridge 21, 22 cannot be transmitted to the output of gate 102. The transistor 52 which is locked and the transistor 51 which is saturated cannot prevent capacitors 54, 55 from energizing through the resistor 56 to a higher logic level (1). Said high logic level then prevents gate 101 from transmitting synchronizing signals outputted by the divider bridge 21, 22. The triac 5 cannot in this case receive any control signal. The relay 3, 4 is open and the system 1, 2 is in safety.

On the contrary, when a flame, because of its conducting properties combined with its rectifying properties, is detected on the electrode 7, a low level, i.e. a logic zero is applied to the input of gate 102 connected to resistor 38, this allowing the passage of the rectangular-shaped signal outputted by the voltage divider 21, 22. Outputted from gate 102, the rectangular-shaped signal alternately controls transistors 51, 52, this preventing capacitors 54, 55 from being energized. Indeed, in a first half period, the transistor 52 discharges the capacitors 54, 55 into the capacitor 53 whereas during the second half-period, the transistor 51 short-circuits the capacitor 53 and reduces its potential to zero.

Figure 2C:
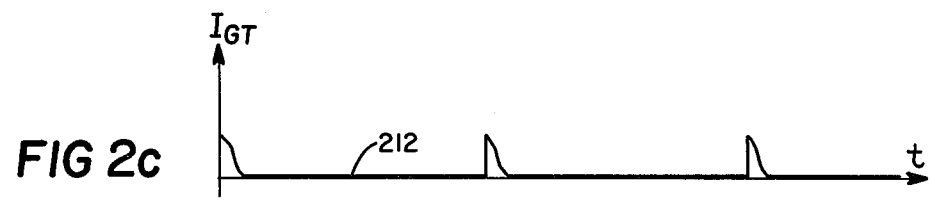
Figure 2D:
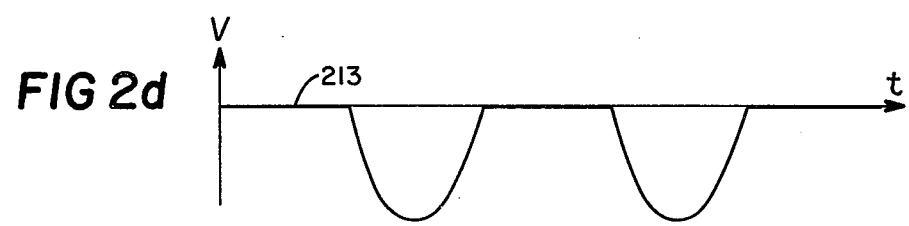

The presence of a flame thus enables the gate 101 to transmit a rectangular-shaped signal which will be differentiated and current-amplified in the circuit 60 so as to produce a pulse signal $I_{GT}$ 212 (FIG. 2c) on the gate of the triac 5. The triac 5 is only voltage-controlled for a half-period as shown by the curve 213 in FIG. 2d. Said triac 5 which is thus correctly controlled, acts as a diode 5a permitting the positive half-period wherein the triac 5 is correctly controlled, the capacitor being energized through the resistor 73 and the triac 5. Through the negative half-period, the capacitor 71 restitutes part of its energy stored in the coil 3 and the contact relay remains closed.

FIG. 3b corresponds to an equivalent diagram for the case where the triac 5 is either continuously controlled or shorted (line 5b). In this case the voltage at the terminals of the trip coil 3 is shaped as shown in FIG. 3d and the contact relay 3, 4 cannot then close.

FIG. 3c corresponds to the case where due to a working failure, the triac 5 is in open circuit or never controlled (hence the absence of connection 5c). The coil 3 is not energized and as a result the contact relay 3, 4 cannot be closed.

As seen hereinabove, the control circuit according to the invention proves to be reliable for controlling an output member such as electro-valve 2. An additional circuit enables to control also the triac 6 controlling the igniter 1 in relation to the information received from the sensor 7, as to the presence or absence of a flame.

FIG. 1 shows an inverter-connected NOR gate 103, of which the output is connected via a resistor 106 to an amplifier circuit 80a composed of a PNP transistor 81 and a resistor 82. Said transistor 81 is connected by its base to the resistor 106, by its collector to the low voltage negative source and by its transmitter to the resistor 82. The triac 6 is thus open if a flame has appeared and closed if the mixture is not ignited.

If, through a normal working cycle, the flame disappears, the system remains controlled as long as the capacitors 54 and 55 are not energized; at the same time the output of gate 103 switches to logic zero, this permitting to saturate the transistor 81 and to supply the igniter via the triac 6.

FIG. 4 shows a variant embodiment of the circuit associated to the triac 6 controlling igniter 1. In this case, the output of the NOR gate 101 which is designed to be connected to the pulse generator 60 controlling the triac 5 (see FIG. 1) is also connected to the inputs of an inverter-connected NOR gate 104. NOR gate 103 then presents a first input connected to the output of NOR gate 102 and a second input connected to the output of NOR gate 104. The output of NOR gate 103 is this time connected via a resistor 106 to a pulse generator 80 connected to the control electrode of the triac 6.

It will be noted that in the case of FIG. 4, the pulse generator 80 comprises a transistor 83, a diode 84, a resistor 85, a capacitor 86 and a resistor 87 all connected in a similar way to the corresponding elements of the pulse generator 60 of FIG. 1.

The invention is in no way limited to the description given hereinabove and on the contrary covers all modifications which can be brought thereto without departing from the scope thereof. By way of example, the control circuit according to the invention can incorporate logic circuits built from NAND type logic gates instead of NOR gates. Also, the triac 5 can of course control directly the coil of a D.C. electro-valve rather than the coil of a relay.

What is claimed is:

1. A fail-safe control system that produces a gate control signal for controlling a gate-controlled device in dependence upon the state of combustion of a burner having a combustion chamber, comprising:

first means coupled to said burner for providing a signal representative of the state of combustion in said combustion chamber;

second means for providing an A.C. supply signal;

third means coupled to said first means and said second means and responsive to said A.C. supply signal for providing a square-wave signal that is synchronous with said A.C. supply signal;

fourth means coupled to said third means and said first means and responsive to said state signal and to said synchronous square-wave signal for providing a first control signal only where said synchronous square-wave signal and said state signal are simultaneously present;

fifth means coupled to said third and said fourth means and responsive to said synchronous square-wave signal and to said first control signal for providing a second control signal only where said synchronous square-wave signal and said first control signal are simultaneously present; and sixth means coupled to said fifth means and said controlled device and responsive to said second control signal for producing said gate control signal that actuates said gate-controlled device only where said second control signal is present.

2. The control circuit as claimed in claim 1, further including an electrovalve for supplying fuel to said burner, and wherein said controlled device is operatively connected to said electrovalve for controlling said electrovalve.

3. The control circuit of claim 2, further including an ignitor coupled to said burner for igniting said fuel supplied to said burner, and further including a second controlled device for actuating said ignitor, and seventh means coupled to said first means for controlling said second controlled device in dependence on said state signal.

4. The control circuit of claim 3, wherein said seventh means includes at least one gate and an amplifying circuit.

5. Control circuit as claimed in claim 1, wherein the fifth means includes a high input impedance logic circuit that comprises a first gate having first and second inputs and an output of which the first input is connected to the synchronous signal, and the second input thereof is connected to the the first control signal, and the output thereof is connected to the sixth means, and wherein the fourth means includes a delay circuit that includes a second gate having first and second inputs and an output of which the first input of the second gate is connected to the synchronous signal, whilst the second input of the second gate is connected to the state signal, and the output of the second gate is connected to the delay circuit.

6. The control circuit as claimed in claim 5, further including an ignitor operatively coupled to said burner for initiating combustion in said combustion chamber, a second controlled device for actuating said ignitor, and seventh means coupled to said second controlled device and to said first means for controlling said ignitor in dependence on said state signal, said seventh means comprising an inverter gate connected to the output of the first gate, and a third gate, of which one input is connected to the output of said second gate, whereas a second gate input is connected to the output of said inverter gate, and the output of the third gate is connected to the second controlled device.

7. Control circuit as claimed in claim 1, wherein the first means and the third means each comprises a voltage divider bridge.

8. Control circuit as claimed in claim 5, further including a circuit coupled to said first and said second means for producing a low D.C. voltage from the A.C. supply voltage and defining a pole.

9. Control circuit as claimed in claim 8, wherein the delay circuit comprises, first and second complementary transistors, the bases of which are connected to the output of the second gate via a connecting resistor, and the emitters are connected together, at least one capacitor connected in parallel to the collector-emitter space of the first transistor and at least one capacitor connected in parallel between the collectors of the first and second transistors, the collector of one of the transistors being connected to the pole of the circuit producing the said low D.C. voltage, whereas the collector of the other transistor is connected, on the one hand, to the second input of the first gate, and on the other hand, via connecting resistor to the second means.

10. Control circuit as claimed in claim 1, wherein the controlled device is a triac.

11. Control circuit as claimed in claim 10, wherein said triac is connected in series with a controllable control member such as a D.C. coil, said control member being itself connected in parallel with a capacitor and a diode, and in series with a resistor.

12. Control circuit as claimed in claim 1, wherein the first means comprises an ionization-type sensor constituted by a simple flame-detecting electrode.

* * * * *